United States Patent [19]

Schuetz

[11] Patent Number: 4,681,812
[45] Date of Patent: Jul. 21, 1987

[54] REACTIVELY SPUTTERED CHROME SILICON NITRIDE RESISTORS

[75] Inventor: James A. Schuetz, Maple Grove, Minn.

[73] Assignee: Honeywell Inc., Minneapolis, Minn.

[21] Appl. No.: 784,987

[22] Filed: Oct. 7, 1985

Related U.S. Application Data

[62] Division of Ser. No. 616,324, May 31, 1984, Pat. No. 4,569,742.

[51] Int. Cl.$^4$ .............................................. B32B 15/00
[52] U.S. Cl. ................................... 428/432; 428/450; 428/539.5; 427/96
[58] Field of Search ............ 428/450, 432, 433, 539.5; 427/96, 82, 45.1, 35

[56] References Cited

U.S. PATENT DOCUMENTS 4,392,992  7/1983  Paulson et al. ...................... 338/306

Primary Examiner—Edith Buffalow
Attorney, Agent, or Firm—William T. Udseth

[57] ABSTRACT

A thin film having high electrical resistivity is produced on a substrate by radio frequency sputtering from a chrome/silicon source in a nitrogen/argon atmosphere.

13 Claims, 4 Drawing Figures

REACTIVELY SPUTTERED CHROME SILICON NITRIDE RESISTORS

This application is a division, of application Ser. No. 616,324, filed 5-31-84 now U.S. Pat. No. 4,569,742.

The present invention relates to thin films with high electrical resistance and, more particularly, to those which may be formed on a semiconductor integrated circuit.

BACKGROUND OF THE INVENTION

In the construction of semiconductor integrated circuits electrical resistors are often provided as thin films on a surface of a semiconductor body. Due to the limited resistivity of such films and the very small space available on a typical integrated circuit chip, only resistors with comparatively small resistance values may be so provided. Larger resistances are typically provided as discrete elements external to the integrated circuit. Such external resistors take up a greater amount of space than integrated film resistors, are typically more expensive to provide, and are inherently less reliable because of the requirement for mechanical interconnections.

A second problem relates to the stability of the electrical resistance of a film. Typically such a film is annealed after deposition. If at a later time the film is heated to a temperature approaching the annealing temperature the resistance value can shift significantly. Film resistors may reach such temperatures when operating in a hot environment. The heat from the ambient conditions combined with heat generated within the semiconductor body and Joule heating of the resistor can drive the actual temperature of the film to high values. Such shifts in resistance values may degrade the performance of a circuit including the resistor or may even prevent the circuit's operation altogether.

SUMMARY OF THE INVENTION

The present invention provides a method of producing a high resistivity film resistor on a surface of a substrate and the film produced thereby. The film is produced by RF sputtering from a chrome/silicon target in a nitrogen/argon atmosphere.

DETAILED DESCRIPTION OF THE PREFERRED EMBODIMENT

The most common substrate with which the films of the present invention may be used as a silicon wafer. Typically the surface of the wafer which is to receive the film is covered by a thin layer of silicon dioxide which provides passivation for the silicon and electrical insulation between the resistive films and any semiconductor devices or portions thereof constructed in the wafer. Semiconductor materials other than silicon, as could other materials such as ceramics or glass, could be used in the substrate, but as silicon is the most common only it will be discussed in the explanation and examples below. The silicon dioxide layer is covered with the resistive film material which is then etched leaving the resistive film only in those regions where it is desired.

In order to produce the film of the present invention a silicon wafer, having a silicon dioxide layer on the surface on which the film is to be formed, is placed in a standard sputtering system. The sputtering chamber is evacuated to about $2 \times 10^{-7}$ Torr. A nitrogen/argon mixture is then introduced into the chamber, bringing the pressure to about $5 \times 10^{-3}$ Torr. The partial pressure of the nitrogen represents approximately 5% of the total pressure. A chromium/silicon sputtering target is used. The target is 27 atomic percent chromium, per vendor's assay, the remainder being silicon. Such targets are available commercially. A radio frequency bias of 40 volts at 13.58 MHz is applied to the substrate and the sputtering is performed with an electrical discharge of 500 watts at 13.58 MHz. This power is approximately 10 watts per square inch of target area. The substrate being coated is placed on a revolving platform to help insure uniform coating in spite of whatever nonuniformities may exist in the distribution of sputtered particles from the sputtering target. During the sputtering nitrogen and argon are introduced into the system at such rates as will maintain the pressures at the values indicated above.

The procedure described above will produce a film having a bulk resistivity of about 2500 $\mu\Omega$cm. The resistivity may be varied by varying the ratio of chromium to silicon in the sputtering target and hence in the deposited film or by varying the rate at which nitrogen is supplied to the sputtering chamber which will, in turn, vary the amount of nitrogen incorporated in the film.

Figure 1:
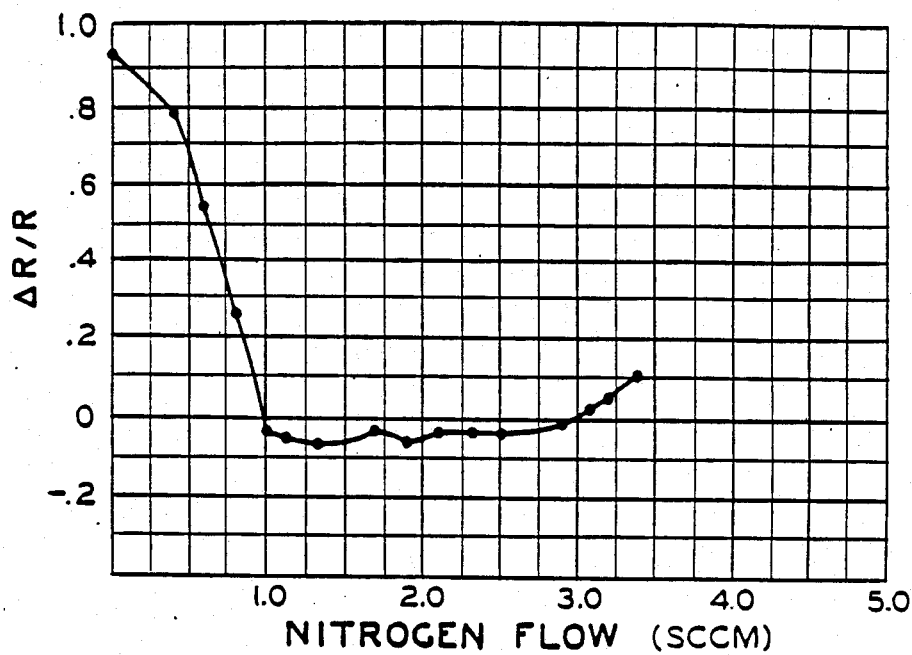
FIG. 1 is a graph of resistivity plotted as a function of nitrogen flow rate for films of the invention formed using a sputtering target comprising 27% chromium and 73% silicon.

FIG. 1 is a graph of resistivities plotted as a function of nitrogen flow rate for sputtering targets composed of 27% chromium and 73% silicon. As may be seen from the graph, as the flow rate is increased from zero the resistivity drops from approximately 2100 $\mu\Omega$cm. When the nitrogen flow rate reaches approximately 1.0 standard cubic cm per minute (sccm) the resistivity reaches a minimum value of approximately 1200 $\mu\Omega$cm. Further increases in the nitrogen flow rate cause the resistivity to rise. From this it is believed that a change in the basic structure of the produced film occurs when the nitrogen flow rate exceeds 1.0 sccm as compared with films produced with lower flow rates.

Figure 2:
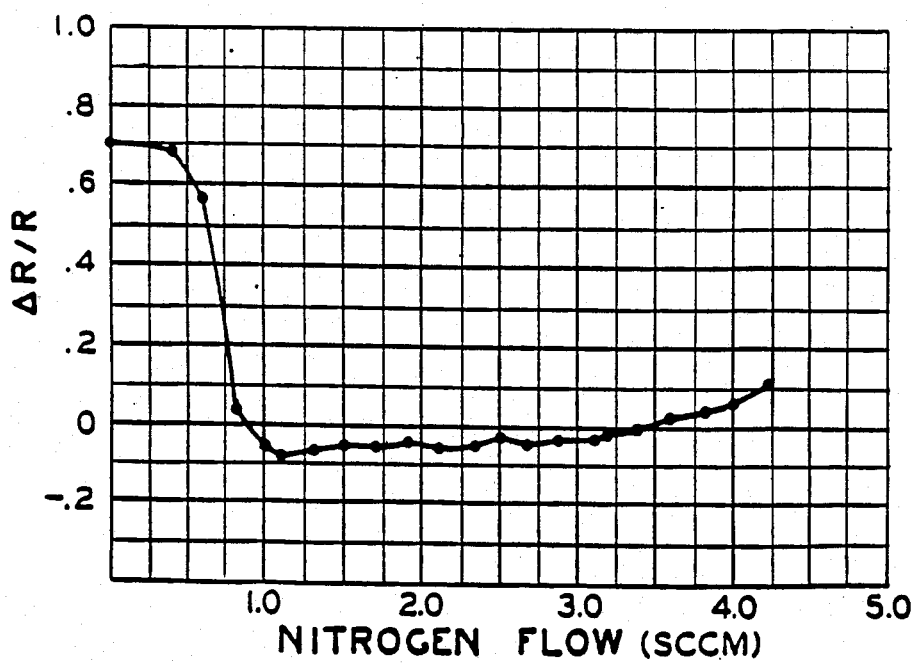
FIG. 2 is a graph of resistivity plotted as a function of nitrogen flow rate for films of the invention formed using a sputtering target comprising 32% chromium and 68% silicon.

FIG. 2 is similar to FIG. 1 except that resistivities of films produced using targets composed of 32% chromium and 68% silicon are plotted. The curve produced may be seen to be generally similar in shape to the curve of FIG. 1, but shifted downward, i.e. toward lower resistivity values. Therefore, increasing the chromium content of the sputtered film may be seen to decrease resistivity while increasing the nitrogen flow rate, above 1.0 sccm, increases resistivity, as in the films of FIG. 1.

Figure 3:
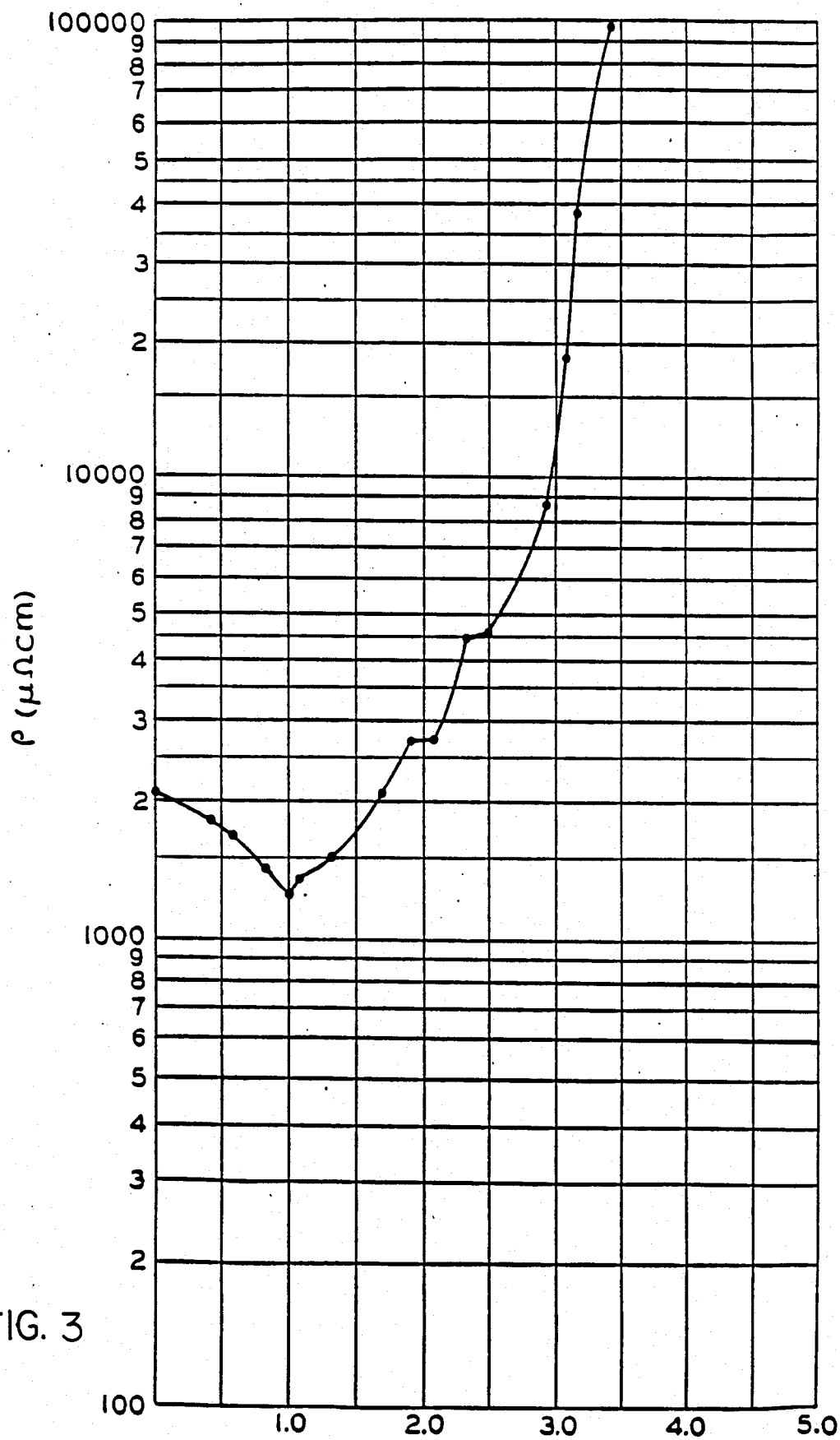
FIG. 3 is a graph of the ratio of the change in resistivity caused by annealing to the resistivity prior to annealing plotted as a function of nitrogen flow rate for films of the invention formed using a sputtering target comprising 27% chromium and 73% silicon.
Figure 4:
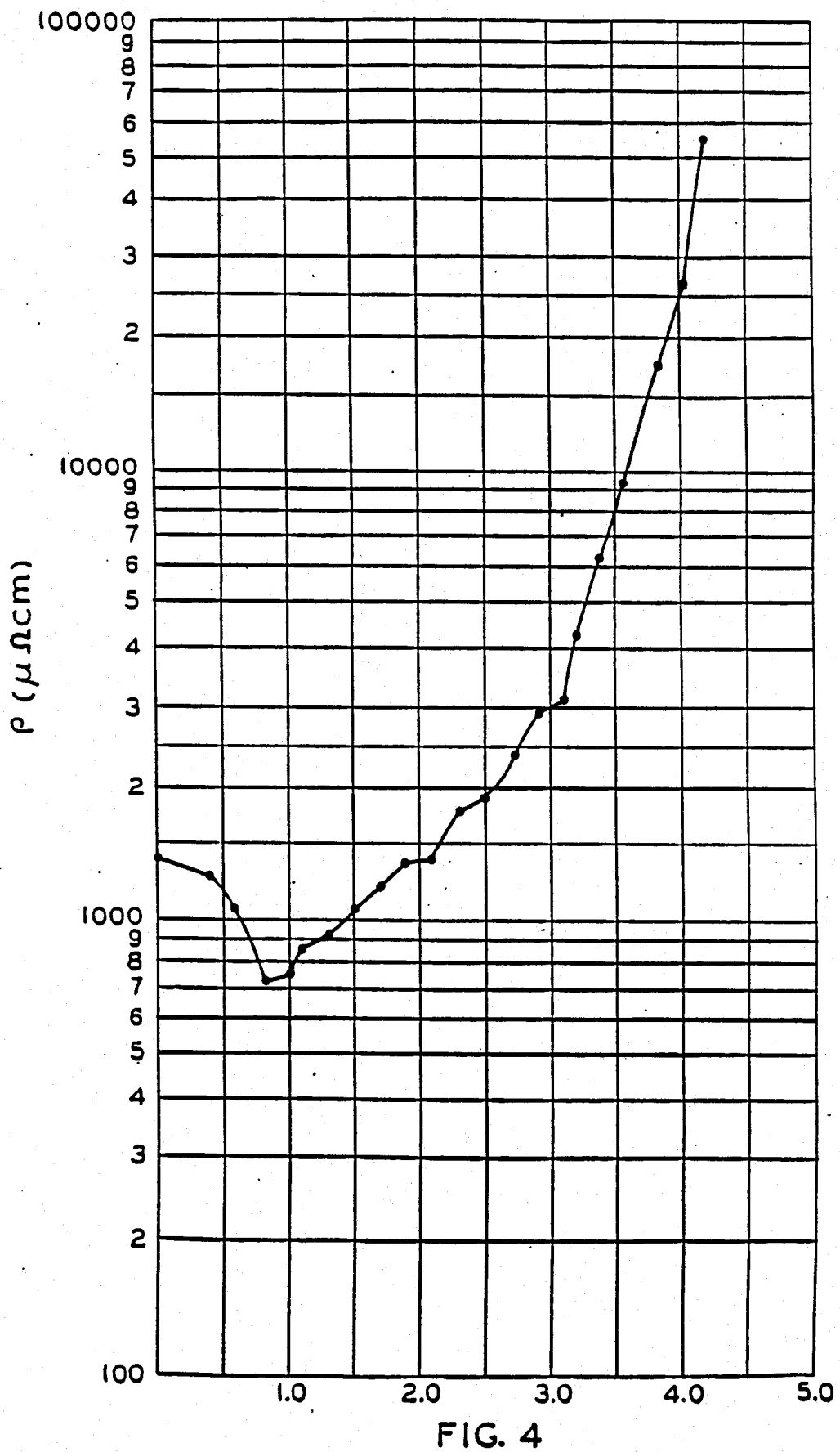
FIG. 4 is a graph of the ratio of the change in resistivity caused by annealing to the resistivity prior to annealing for films of the invention formed using a sputtering target comprising 23% chromium and 68% silicon.

Another important consideration in the manufacture of resistive films is the stability of such films under thermal stress. As explained above, prior art film resistors tend to suffer large shifts in resistance when heated to a temperature approaching the initial annealing temperature. Experimentally it has been shown that an indication of the amount of such a shift which can be expected is given by the change in resistance which occurs as a result of the initial annealing. FIGS. 3 and 4 plot the ratio of the change in resistance caused by the annealing to the initial resistance before the annealing ($\Delta R/R$) as a function of the nitrogen flow rate for films formed from the 27% chromium target and the 32% chromium target, respectively. These graphs show a large change in resistance for low nitrogen flow rates. As the flow rate increases the ratio of the change in resistance to the initial resistance drops rapidly until the flow rate reaches approximately 1.0 sccm. At that flow rate the change in resistance levels off at a slightly negative value and changes very slowly with increased flow rates. These data help confirm the belief that nitrogen flow rates over 1.0 sccm produce films of different structure than those produced at lower flow rates.

Table 1 below gives values of resistivity ($\rho$), temperature coefficient of resistance (TCR), and $\Delta R/R$ for four specific films manufactured as described above. The values of resistivity are given in $\mu\Omega$cm and the values of TCR are given in parts per million per Celsius degree (ppm/C.°) at a temperature of 100° C. The films characterized in Table 1 were annealed at a temperature of 450° C. for thirty minutes in a nitrogen atmosphere. The left column of Table 1 indicates chromium content of the targets used to produce the films. In each case the remainder was silicon.

TABLE 1

| Chromium Content | N₂ Flow | Pre-anneal $\rho$ | Pre-anneal TCR | Post-anneal $\rho$ | Post-anneal TCR | $\Delta R/R$ |
|---|---|---|---|---|---|---|
| 45% | 4.9 sccm | 63,000 | −319 | 66,240 | −244 | .051 |
| 27% | 3.0 sccm | 54,400 | −409 | 58,400 | −278 | .074 |
| 45% | 4.0 sccm | 2,215 | −216 | 2,205 | −153 | −.005 |
| 27% | 2.0 sccm | 2,815 | −289 | 2,685 | −127 | −.046 |

As explained above, the small changes in resistivity as a result of annealing, shown in Table 1, indicate that the films should exhibit very stable resistivities in spite of thermal stress. This is confirmed by the fact that integrated resistors manufactured according to the invention exhibited a resistance shift of less than 0.05% after second and subsequent anneals at the same temperature as the first anneal. Furthermore such resistors exhibited resistance shifts of less than 0.01% after 400 hours of storage at a temperature of 150° C. Other tests have shown changes in resistance values of less than 0.01% after films have been cycled from between −50° C. and 150° C. ten times. This indicates that the films of the invention exhibit good stability under temperature cycling.

In the process described above a 40 volt bias was applied to the substrate on which the resistive film was to be formed. Such a bias voltage is necessary if the TCR of the film produced is to be close to zero. Films produced with no substrate bias have exhibited TCR's as great as −1800 ppm/C.°. As a TCR with a low absolute value is generally desirable, bias voltages in the range 40 to 60 volts are typically preferable. Table 2 indicates the relationship of TCR to bias voltage for six films produced according to the invention. As in Table 1 the values of TCR are for films at 100° C.

TABLE 2

| Power (W/in²) | Bias (Volts) | N₂ Flow (sccm) | TCR (ppm/C.°) |
|---|---|---|---|
| 10 | 10 | 1.9 | −218 |
| 10 | 40 | 1.9 | −56 |
| 10 | 60 | 1.9 | −133 |
| 10 | 20 | 2.9 | −324 |
| 10 | 40 | 2.9 | −220 |
| 10 | 60 | 2.9 | −215 |

As may be seen from Table 2 the absolute value of the TCR is reduced when a film is formed with an electrical bias in the 40 to 60 volt range as compared with similar films formed with lower substrate bias voltages.

The following examples will help to illustrate the invention. These examples are not intended to limit the invention in any way, but serve only to exemplify specific embodiments of the invention. In each of the examples the film was formed on a silicon wafer having a thin silicon dioxide layer on the surface where the resistive film was formed.

EXAMPLE 1

A film was formed by sputtering from a target composed of 27% chromium and 73% silicon. An argon flow rate of 37 sccm and a nitrogen flow rate of 3.8 sccm were used to maintain a pressure of $4.2 \times 10^{-3}$ Torr during the sputtering. A radio frequency discharge of 10 watts/in² relative to the target was provided at a frequency of 13.58 MHz. The target was biased at 950 volts and the substrate on which the film was formed was biased at zero volts. The film which was formed exhibited a resistivity of approximately 82,500 $\mu\Omega$cm and a TCR of approximately −1600 ppm/C.° at 100° C. This example illustrates the large absolute value TCR which arises in films produced with no substrate bias.

EXAMPLE 2

A film was produced by sputtering from a target composed of 27% chromium and 73% silicon. The sputtering was performed at a pressure of $4.2 \times 10^{-3}$ Torr with an argon flow rate of 39.5 sccm and a nitrogen flow rate of 2.0 sccm. A radio frequency discharge of 10 watts/in² relative to the target was provided at a frequency of 13.58 MHz. The target was biased at 950 volts and the substrate at 40 volts. The resulting film had a resistivity of approximately 5150 $\mu\Omega$cm and a TCR of −142 ppm/C.° at 100° C.

EXAMPLE 3

A film was produced by sputtering from a target composed of 27% chromium and 73% silicon. The sputtering was performed at a pressure of $4.2 \times 10^{-3}$ Torr with an argon flow rate of 39.5 sccm and a nitrogen flow rate of 2.60 sccm. A radio frequency discharge of 10 watts/in² relative to the target was provided at a frequency of 13.58 MHz. The target was biased at 950 volts and the substrate at 40 volts. The resulting film exhibited a resistivity of approximately 25,300 $\mu\Omega$cm and a TCR of approximately −227 ppm/C.° at 100° C.

EXAMPLE 4

A film was produced by sputtering from a target composed of 27% chromium and 73% silicon. The sputtering was performed at a pressure of $4.2 \times 10^{-3}$ Torr with an argon flow rate of 39.5 sccm and a nitrogen flow rate of 2.95 sccm. A radio frequency discharge of 10 watts/in$^2$ relative to the target was provided at a frequency of 13.58 MHz. The target was biased at 950 volts and the substrate at 40 volts. The resulting film exhibited a resistivity of approximately 320,000 $\mu\Omega$cm and a TCR of approximately $-410$ ppm/C.° at 100° C.

EXAMPLE 5

A film was produced by sputtering from a target composed of 27% chromium and 73% silicon. The sputtering was performed at a pressure of $4.3 \times 10^{-3}$ Torr with an argon flow rate of 39.7 sccm and a nitrogen flow rate of 1.75 sccm. A radio frequency discharge of 10 watts/in$^2$ relative to the target was provided with a frequency of 13.58 MHz. The target was biased at 1000 volts and the substrate at 30 volts. The resulting film exhibited a resistivity of approximately 2575 $\mu\Omega$cm and a TCR of approximately $-155$ ppm/C.° at 100° C.

EXAMPLE 6

A film was produced by sputtering from a target composed of 32% chromium and 68% silicon. The sputtering was performed at a pressure of $4.2 \times 10^{-3}$ Torr with an argon flow rate of 38.0 sccm and a nitrogen flow rate of 3.8 sccm. A radio frequency discharge of 10 watts/in$^2$ relative to the target was provided with a frequency of 13.58 MHz. The target was biased at 1000 volts and the substrate at 40 volts. The resulting film exhibited a resistivity of approximately 24,000 $\mu\Omega$cm and a TCR of approximately $-261$ ppm/C.° at 100° C.

EXAMPLE 7

A film was produced by sputtering from a target composed of 27% chromium and 73% silicon. The sputtering was performed at a pressure of $4.5 \times 10^{-3}$ Torr with an argon flow rate of 37.0 sccm and a nitrogen flow rate of 3.4 sccm. A radio frequency discharge of 10 watts/in$^2$ relative to the target was provided with a frequency of 13.58 MHz. The target was biased at 1050 volts and the substrate at 40 volts. The resulting film exhibited a resistivity of approximately 30,800 $\mu\Omega$cm and a TCR of approximately $=224$ ppm/C.° at 100° C.

The embodiments of the invention in which an exclusive property or right is claimed are defined as follows:

1. An electrically resistive thin film, produced on a substrate by a method comprising:
   placing said substrate and a sputtering target comprising silicon and chromium in a reaction chamber;
   evacuating said reaction chamber;
   providing a sputtering atmosphere comprising nitrogen and argon in said reaction chamber;
   applying an electrical bias voltage to said substrate; and
   providing a radio frequency electrical discharge in said reaction chamber.

2. The thin film of claim 1 wherein said electrical bias voltage is a radio frequency bias voltage.

3. The thin film of claim 1 wherein said electrical bias voltage is in the range of 40 to 60 volts.

4. The thin film of claim 1 wherein said nitrogen is provided to said reaction chamber at a rate greater than 1.0 sccm.

5. The thin film of claim 2 wherein said nitrogen is provided to said reaction chamber at a rate greater than 1.0 sccm.

6. The thin film of claim 5 wherein said sputtering target comprises chromium in a range of 27 to 45 atomic percent.

7. The method of claim 6 wherein said electrical bias voltage is in a range of 40 to 60 volts.

8. The method of claim 1 wherein said sputtering atmosphere exerts a pressure in a range of $4 \times 10^{-3}$ to $5 \times 10^{-3}$ torr while said radio frequency electrical discharge is being provided.

9. The method of claim 8 wherein said electrical bias voltage is in the range of 40 to 60 volts.

10. The method of claim 9 wherein said electrical bias voltage is a radio frequency bias voltage.

11. The method of claim 1 wherein gas pressure in said reaction chamber is reduced to no greater than $2 \times 10^{-7}$ torr during said evacuation step.

12. The thin film of claim 11 wherein said sputtering atmosphere exerts a pressure in a range of $4 \times 10^{-3}$ to $5 \times 10^{-3}$ torr while said radio frequency electrical discharge is being provided.

13. The thin film of claim 12 wherein said electrical bias voltage is a radio frequency bias voltage.

* * * * *